United States Patent
Komatsu

(10) Patent No.: US 11,658,050 B2
(45) Date of Patent: May 23, 2023

(54) CUTTING BLADE POSITION DETECTING METHOD

(71) Applicant: DISCO CORPORATION, Tokyo (JP)

(72) Inventor: Atsushi Komatsu, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 221 days.

(21) Appl. No.: 17/147,610

(22) Filed: Jan. 13, 2021

(65) Prior Publication Data

US 2021/0242055 A1 Aug. 5, 2021

(30) Foreign Application Priority Data

Jan. 31, 2020 (JP) .............................. JP2020-015006

(51) Int. Cl.
*H01L 21/67* (2006.01)
(52) U.S. Cl.
CPC .. *H01L 21/67259* (2013.01); *H01L 21/67092* (2013.01)
(58) Field of Classification Search
CPC ............................................... H01L 21/67259
See application file for complete search history.

(56) References Cited

U.S. PATENT DOCUMENTS

| | | | |
|---|---|---|---|
| 10,576,585 B1 * | 3/2020 | Donofrio ................. | B28D 5/00 |
| 2019/0067108 A1 * | 2/2019 | Tanaka ................. | B23K 26/043 |
| 2019/0229005 A1 * | 7/2019 | Tanaka ................. | H01L 21/786 |
| 2019/0273010 A1 * | 9/2019 | Yamamoto ............ | B25B 11/005 |
| 2021/0210375 A1 * | 7/2021 | Kojima ................. | B23K 26/083 |
| 2021/0213480 A1 * | 7/2021 | Wajiki .............. | H01L 21/67109 |
| 2022/0199446 A1 * | 6/2022 | Kim .................. | H01L 21/68707 |
| 2022/0230903 A1 * | 7/2022 | Wang ....................... | H01L 22/20 |
| 2022/0277981 A1 * | 9/2022 | Amikura ................. | H01L 21/68 |

FOREIGN PATENT DOCUMENTS

| | | | |
|---|---|---|---|
| JP | 2000173961 A | | 6/2000 |
| JP | 2002059365 A | | 2/2002 |

* cited by examiner

*Primary Examiner* — Omar Flores Sanchez
(74) *Attorney, Agent, or Firm* — Greer Burns & Crain Ltd.

(57) ABSTRACT

A cutting blade position detecting method using a cutting apparatus including a holding table that holds a workpiece, and a cutting unit in which a cutting blade for cutting the workpiece held by the holding table is mounted in a rotatable state, includes a groove forming step of causing the cutting blade to further cut into the workpiece including a first groove formed by causing the cutting blade to cut into the workpiece, to form the workpiece with a second groove of which one end portion in a width direction does not overlap with the first groove whereas another end portion in the width direction overlaps with the first groove, and a calculating step of calculating the lower end position of the cutting blade based on a length of the one end portion in the width direction of the second groove formed in the workpiece.

6 Claims, 8 Drawing Sheets

CUTTING BLADE POSITION DETECTING METHOD

BACKGROUND OF THE INVENTION

Field of the Invention

The present invention relates to a cutting blade position detecting method for detecting the position of a cutting blade for cutting a workpiece.

Description of the Related Art

In a manufacturing process of device chips, use is made of a wafer formed with devices such as integrated circuits (ICs) and large scale integrations (LSIs) respectively in a plurality of regions partitioned by a plurality of streets arranged in a grid pattern. The wafer is divided along the streets, whereby a plurality of device chips including the devices are obtained. The device chips are mounted on various electronic equipment such as mobile phones and personal computers.

For dividing the wafer, for example, a cutting apparatus is used. The cutting apparatus includes a holding table that holds the wafer, and a cutting unit to which an annular cutting blade for cutting the wafer is mounted. By rotating the cutting blade and causing the cutting blade to cut into the wafer, the wafer is cut and divided. In addition, in recent years, attendant on a reduction in the size of electronic apparatuses, thinning of the device chips is demanded. In view of this, processing for thinning the wafer before division of the wafer may be conducted. For example, the back surface side of the wafer before division is subjected to grinding, whereby the wafer is thinned. By dividing the wafer after thinning the wafer, thinned device chips are obtained.

Note that the wafer is subjected to so-called chamfering in which a peripheral portion of the wafer is ground to bring a peripheral edge (side surface) of the wafer into an arcuate shape. When the chamfered wafer is thinned by grinding, the peripheral portion of the wafer is brought into a sharpened shape (knife edge shape). When the peripheral portion of the wafer is brought into the knife edge shape, chipping or cracking is liable to occur at the peripheral portion of the wafer, whereby the wafer may be damaged. In view of this, before thinning the wafer by grinding, the wafer is subjected to a processing called edge trimming in which the peripheral edge of the wafer is cut in an annular shape from the front surface side by a cutting blade to form a stepped part at the peripheral portion of the wafer (see, for example, Japanese Patent Laid-open No. 2000-173961). When the edge trimming is performed, the peripheral portion of the wafer is not brought into the knife edge shape upon subsequent thinning of the wafer by grinding the back surface side of the wafer. As a result, damaging of the wafer is prevented.

In the above-mentioned edge trimming, a highly accurate adjustment of the cutting-in depth of the cutting blade into the wafer (the distance from the front surface of the wafer to the lower end of the cutting blade) may be demanded. However, the cutting-in depth may slightly vary according to the material of the wafer, processing conditions, operation status of the cutting apparatus, etc., and the cutting of the wafer may not be performed in the intended cutting-in depth, by only inputting a desired cutting-in depth value to the cutting apparatus.

In view of this problem, a test may be conducted in which a cutting blade is made to cut into a test workpiece to form a groove (cut groove) in the workpiece, and the lower end position of the cutting blade is calculated based on the length of the groove (see, for example, Japanese Patent Laid-open No. 2002-59365). With this test conducted before cutting the wafer, it is possible to adjust the cutting-in depth of the cutting blade according to the actual lower end position of the cutting blade, whereby the accuracy of cutting-in depth is enhanced.

SUMMARY OF THE INVENTION

At the time of processing a workpiece by a cutting blade, as described above, a test of detecting the lower end position of the cutting blade is conducted. This test includes a step of causing the cutting blade to cut into a test workpiece (cut groove forming workpiece) to form a cut groove in the cut groove forming workpiece. Besides, for saving the cut groove forming workpiece, the test is carried out a plurality of times using a single sheet of cut groove forming workpiece. In this case, a plurality of cut grooves are formed in the cut groove forming workpiece.

Here, in the above-mentioned test, the outline of the groove formed in the cut groove forming workpiece is confirmed, and the lower end position of the cutting blade is calculated based on the length of the groove. Therefore, in the case where the test is carried out a plurality of times using a single sheet of cut groove forming workpiece, the cut groove newly formed is formed so as not to overlap with the cut groove already formed in the cut groove forming workpiece. Consequently, the number of cut grooves that can be formed in a single sheet of cut groove forming workpiece is limited, and frequent replacement of the cut groove forming workpiece is required.

Particularly, in the aforementioned edge trimming, a comparatively thick cutting blade with a width on the order of 1 to 3 mm is often used. In the case of detecting the position of such a cutting blade, the width of the cut groove formed in the cut groove forming workpiece is also enlarged, and the number of cut grooves that can be formed in a single sheet of cut groove forming workpiece is further limited. As a result, the amount of the cut groove forming works to be used is increased, and cost is increased.

The present invention has been made in consideration of the above-mentioned problems. It is an object of the present invention to provide a cutting blade position detecting method while makes it possible to reduce the amount of a workpiece to be used for detecting the position of a cutting blade.

In accordance with an aspect of the present invention, there is provided a cutting blade position detecting method for detecting a lower end position of a cutting blade, using a cutting apparatus including a holding table that holds a workpiece, and a cutting unit in which the cutting blade for cutting the workpiece held by the holding table is mounted in a rotatable state. The cutting blade position detecting method includes a groove forming step of causing the cutting blade to further cut into the workpiece including a first groove formed by causing the cutting blade to cut into the workpiece, to form the workpiece with a second groove of which one end portion in a width direction does not overlap with the first groove whereas another end portion in the width direction overlaps with the first groove, and a calculating step of calculating the lower end position of the cutting blade based on a length of the one end portion in the width direction of the second groove formed in the workpiece.

In the cutting blade position detecting method according to one aspect of the present invention, the cutting blade is made to further cut into a workpiece already formed with a first groove, to form the workpiece with a second groove of which one end portion in the width direction does not overlap with the first groove whereas the other end portion in the width direction overlaps with the first groove. As a result, more grooves can be formed in a single sheet of workpiece, and the amount of the workpiece to be used is reduced.

The above and other objects, features and advantages of the present invention and the manner of realizing them will become more apparent, and the invention itself will best be understood from a study of the following description and appended claim with reference to the attached drawings showing a preferred embodiment of the invention.

DETAILED DESCRIPTION OF THE PREFERRED EMBODIMENT

Figure 1:
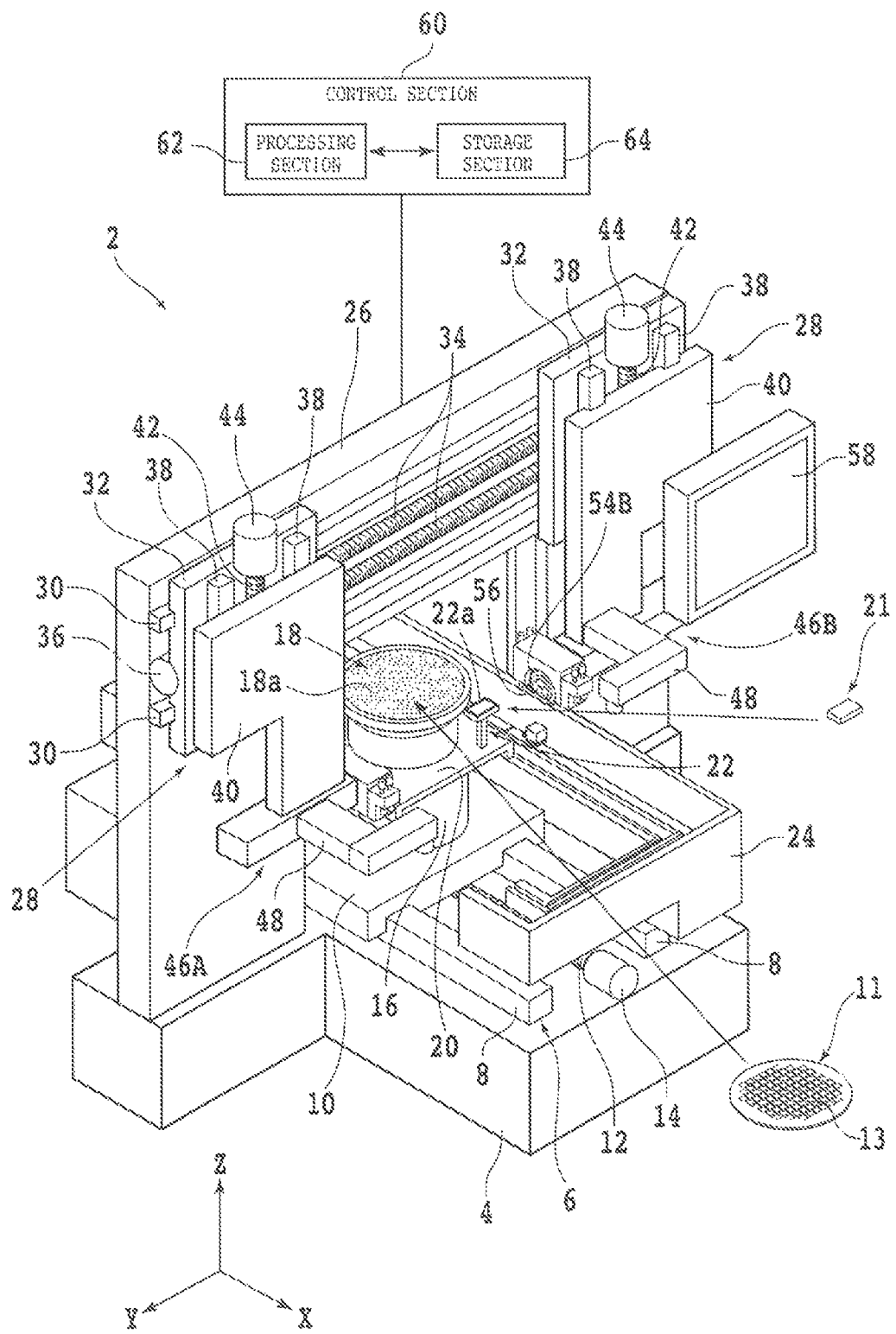
FIG. 1 is a perspective view of a cutting apparatus.

An embodiment according to a mode of the present invention will be described below referring to the attached drawings. First, a configuration example of a cutting apparatus that can be used for a cutting blade position detecting method according to the present embodiment will be described. FIG. 1 is a perspective view of the cutting apparatus 2.

The cutting apparatus 2 includes a base 4 on which to mount components of the cutting apparatus 2, and a moving mechanism (moving unit) 6 is provided on an upper surface side of the base 4. The moving mechanism 6 includes a pair of X-axis guide rails 8 disposed along an X-axis direction (a processing feeding direction, a front-rear direction), and an X-axis moving table 10 is mounted to the pair of X-axis guide rails 8 in such a state as to be slidable along the X-axis guide rails 8. A nut section (not illustrated) is provided on a lower surface (back surface) side of the X-axis moving table 10, and an X-axis ball screw 12 disposed along the pair of X-axis guide rails 8 is in screw engagement with the nut section. In addition, an X-axis pulse motor 14 is connected to one end portion of the X-axis ball screw 12. When the X-axis ball screw 12 is rotated by the X-axis pulse motor 14, the X-axis moving table 10 is moved in the X-axis direction along the X-axis guide rails 8. Note that the moving mechanism 6 is provided with a detector (not illustrated) that detects the position of the X-axis moving table 10 in the X-axis direction.

A cylindrical table base 16 is provided on an upper surface (front surface) side of the X-axis moving table 10. Besides, a holding table (chuck table) 18 that holds a workpiece 11 as an object of processing by the cutting apparatus 2 is provided at an upper portion of the table base 16. An upper surface of the holding table 18 constitutes a holding surface 18a that holds the workpiece 11. The holding surface 18a is formed to be substantially parallel to the X-axis direction and a Y-axis direction (an indexing feeding direction, a left-right direction), and is connected to a suction source (not illustrated) such as an ejector through a flow channel (not illustrated) formed inside the holding table 18, and the like.

By moving the X-axis moving table 10 in the X-axis direction by the moving mechanism 6, processing feeding of the holding table 18 is conducted. In addition, a rotational drive source (not illustrated) such as a motor is connected to the holding table 18, and the rotational drive source rotates the holding table 18 around a rotational axis substantially parallel to a Z-axis direction (the vertical direction, an upward-downward direction). Further, a carrying mechanism (not illustrated) that carries the workpiece 11 onto the holding table 18 is provided in the vicinity of the holding table 18.

A plate-shaped support base 20 is fixed to the table base 16 so as to surround the table base 16. A holding table (sub chuck table) 22 that holds a workpiece 21 is provided on an upper surface side of the support base 20. The workpiece 21 is a cut groove forming workpiece which is used when detecting the lower end positions of cutting blades 54A and 54B to be described later. An upper surface of the holding table 22 constitutes a holding surface 22a that holds the workpiece 21. The holding surface 22a is formed to be substantially parallel to the X-axis direction and the Y-axis direction and is connected to a suction source (not illustrated) such as an ejector through a flow channel (not illustrated) formed inside the holding table 22, and the like.

A water case 24 for temporarily storing, for example, a waste liquid of a cutting liquid (pure water or the like) used for cutting is provided in the periphery of the X-axis moving table 10. The waste liquid stored in the inside of the water case 24 is discharged to the exterior of the cutting apparatus 2 through a drain (not illustrated) or the like.

In addition, a gate-shaped support structure 26 is disposed on an upper surface side of the base 4 so as to straddle the moving mechanism 6. A pair of moving mechanisms (moving units) 28 are provided at an upper portion on a front surface side of the support structure 26. Specifically, a pair of Y-axis guide rails 30 are fixed to a front surface side of the support structure 26 along the Y-axis direction, and flat plate-shaped Y-axis moving plates 32 possessed by the pair of moving mechanisms 28 are mounted to the pair of Y-axis guide rails 30 in a state of being slidable along the Y-axis guide rails 30. Besides, a pair of Y-axis ball screws 34 are provided between the pair of Y-axis guide rails 30 along the Y-axis guide rails 30. Nut sections (not illustrated) are provided on a rear surface (back surface) side of the Y-axis moving plates 32, and the nut sections are in screw engagement with Y-axis ball screws 34. In addition, Y-axis pulse motors 36 are connected to respective one-side end portions of the pair of Y-axis ball screws 34. When the Y-axis ball screw 34 is rotated by the Y-axis pulse motor 36, the Y-axis moving plate 32 is moved in the Y-axis direction along the Y-axis guide rails 30. Besides, the moving mechanism 28 is provided with a detector (not illustrated) that detects the position of the Y-axis moving plate 32 in the Y-axis direction.

A pair of Z-axis guide rails 38 are each disposed on a front surface side of each of the Y-axis moving plates 32 along the Z-axis. A flat plate-shaped Z-axis moving plate 40 is mounted to the Z-axis guide rails 38 in a state of being slidable along the Z-axis guide rails 38. In addition, a Z-axis ball screw 42 is provided between the pair of Z-axis guide rails 38 along the Z-axis guide rails 38. A nut section (not illustrated) is provided on a rear surface (back surface) side of the Z-axis moving plate 40, and the nut section is in screw engagement with the Z-axis ball screw 42. A Z-axis pulse motor 44 is connected to one end portion of the Z-axis ball screw 42. When the Z-axis ball screw 42 is rotated by the Z-axis pulse motor 44, the Z-axis moving plate 40 is moved in the Z-axis direction along the Z-axis guide rails 38.

A cutting unit 46A for cutting the workpiece 11 is fixed to a lower portion of the Z-axis moving plate 40 possessed by the moving mechanism 28 on one side. In addition, a cutting unit 46B for cutting the workpiece 11 is fixed to a lower portion of the Z-axis moving plate 40 possessed by the moving mechanism 28 on the other side. Imaging units (cameras) 48 for imaging the workpiece 11 held by the holding table 18 or the workpiece 21 held by the holding table 22 are provided at respective positions adjacent to the cutting units 46A and 46B.

By moving the Y-axis moving plates 32 in the Y-axis direction, the cutting units 46A and 46B and the imaging units 48 are moved along the Y-axis direction. In addition, by moving the Z-axis moving plates 40 in the Z-axis direction, the cutting units 46A and 46B and the imaging unit 48 are moved upward or downward and are moved along a direction substantially perpendicular to the holding surface 18a of the holding table 18 and the holding surface 22a of the holding table 22.

Figure 2:
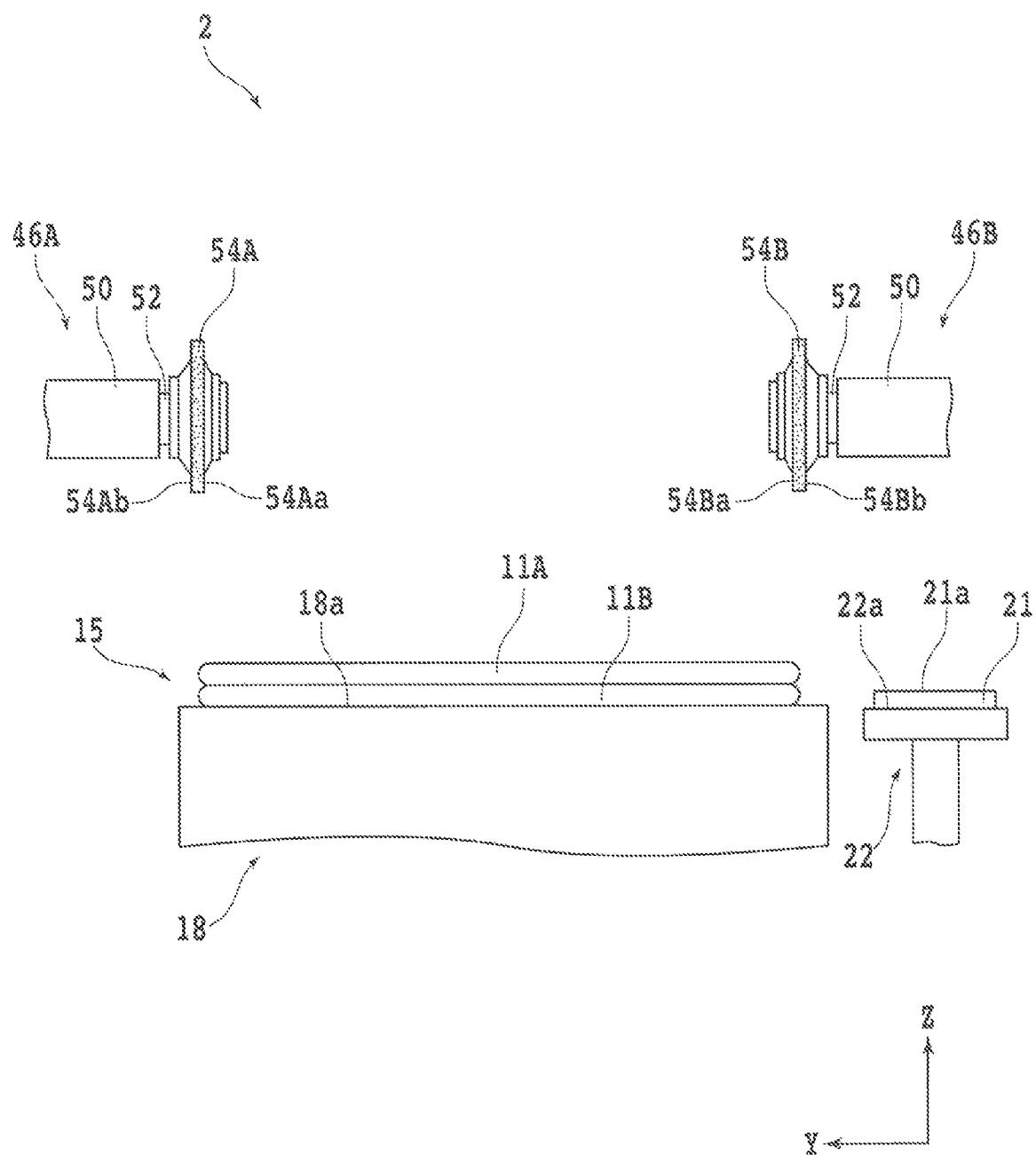
FIG. 2 is a front view of a holding table and a cutting unit.

FIG. 2 is a front view of the holding tables 18 and 22 and the cutting units 46A and 46B. Note that in FIG. 2, the holding table 18 and the holding table 22 are depicted at spaced positions, for convenience of explanation.

The cutting units 46A and 46B each include a tubular housing 50 supported by the moving mechanism 28 (see FIG. 1). A spindle (rotary shaft) 52 disposed along the Y-axis direction is accommodated in the housing 50. A tip end portion (one end side) of the spindle 52 is exposed to the exterior of the housing 50. In addition, a base end portion (the other end side) of the spindle 52 is connected to a rotational drive source (not illustrated) such as a motor, and the rotational drive source rotates the spindle 52 around a rotational axis substantially parallel to the Y-axis direction.

An annular cutting blade 54A (first cutting blade) is mounted to a tip end portion of the spindle 52 possessed by the cutting unit 46A. In addition, an annular cutting blade 54B (second cutting blade) is mounted to a tip end portion of the spindle 52 possessed by the cutting unit 46B. The cutting blade 54A and the cutting blade 54B are disposed so as to face each other.

The cutting blade 54A mounted to the cutting unit 46A includes a side surface (end portion) 54Aa located on a side (cutting unit 46B side, the right side in FIG. 2) opposite to the housing 50 and the spindle 52 of the cutting unit 46A, and a side surface (end portion) 54Ab located on the side (the left side in FIG. 2) of the housing 50 and the spindle 52 of the cutting unit 46A. In addition, the cutting blade 54B mounted to the cutting unit 46B includes a side surface (end portion) 54Ba located on a side (cutting unit 46A side, the left side in FIG. 2) opposite to the housing 50 and the spindle 52 of the cutting unit 46B, and a side surface (end portion) 54Bb located on a side (the right side in FIG. 2) of the housing 50 and the spindle 52 of the cutting unit 46B.

As each of the cutting blades 54A and 54B, there is used, for example, a hub-type cutting blade having a configuration in which an annular base including a metal or the like and an annular cutting edge formed along an outer peripheral edge of the base are united with each other. The cutting edge of the hub-type cutting blade includes an electroformed grindstone in which abrasive grains of diamond or the like are fixed by a binder such as a nickel plating layer. It is to be noted, however, that the materials of the abrasive grains and the binder of the cutting blades 54A and 54B, the particle diameter of the abrasive grains, and the like are not limited, but are selected, as required, according to the materials of the works 11 and 21 as objects of processing, the processing conditions, and the like. Besides, the cutting blades 54A and 54B may each be a washer-type cutting blade including an annular cutting edge in which abrasive grains are fixed by a binder such as a metal, a ceramic, or a resin.

The cutting units 46A and 46B are each provided with a nozzle 56 (see FIG. 1) for supplying a cutting liquid such as pure water to the cutting blades 54A and 54B. When the works 11 and 21 are cut by the cutting blades 54A and 54B, the cutting liquid is supplied from the nozzles 56. As a result, the works 11 and 21 and the cutting blades 54A and 54B are cooled, and swarf (cutting swarf) generated by cutting is washed away.

The cutting apparatus 2 depicted in FIGS. 1 and 2 is a so-called facing dual spindle type cutting apparatus which includes the two cutting units 46A and 46B and in which the pair of cutting blades 54A and 54B are disposed so as to face each other. It is to be noted, however, that the number of the cutting units possessed by the cutting apparatus 2 may be one set.

A display section (display device) 58 that displays various kinds of information concerning the cutting apparatus 2 is provided on a front surface side of the cutting apparatus 2. For example, the display section 58 is a display, on which information (processing conditions, processing status, etc.) concerning processing of the works 11 and 21, images of the works 11 and 21 before, after, or during processing, and the like are displayed. Note that the display section 58 may be a touch panel. In this case, the touch panel functions also as an input section (input device) for inputting various information to the cutting apparatus 2. Operation keys (a keyboard, ten keys, etc.) are displayed on the touch panel together with the information concerning the cutting apparatus 2. The operator can input the information such as processing conditions to the cutting apparatus 2 by touch operations on the touch panel.

Further, the cutting apparatus 2 includes a control section (control unit) 60 connected to the components (the moving mechanism 6, the holding table 18, the holding table 22, the moving mechanism 28, the cutting units 46A and 46B, the imaging unit 48, the display section 58, etc.) constituting the cutting apparatus 2. The control section 60 controls respective operations of the components of the cutting apparatus 2. For example, the control section 60 includes a computer, and includes a processing section 62 that performs various processing (arithmetic processing and the like) necessary for the operation of the cutting apparatus 2, and a storage section 64 in which various information (data, program, etc.) used for processing by the processing section 62 is stored. The processing section 62 includes a processor such as, for example, a central processing unit (CPU). Further, the storage section 64 includes a memory such as a read only memory (ROM) and a random access memory (RAM). The processing section 62 and the storage section 64 are connected to each other through a bus.

By the cutting apparatus 2, cutting of the workpiece 11 is conducted. The workpiece 11 is, for example, a disk-shaped silicon wafer. The workpiece 11 is partitioned into a plurality of regions by streets arranged in a grid pattern so as to intersect each other, and devices 13 such as ICs and LSIs are formed respectively on an upper surface (front surface) side of the regions. It is to be noted, however, that the material, shape, structure, size, and the like of the workpiece 11 are not limited. For example, the workpiece 11 may be an optionally shaped wafer of a material such as a semiconductor (GaAs, InP, GaN, SiC, etc.) other than silicon, a glass, a ceramic, a resin, or a metal. In addition, the kind, number, shape, structure, size, layout, and the like of the devices 13 are also not limited, and the workpiece 11 may not be formed with the devices 13. Further, the workpiece 11 may be a package substrate in which a plurality of device chips mounted on a rectangular substrate are covered with a sealing material (molding resin) including a resin.

When the cutting blade 54A or the cutting blade 54B is made to cut into the workpiece 11 to divide the workpiece 11 along the streets, a plurality of device chips each including the devices 13 are formed. Besides, when the workpiece 11 before division is ground or polished to thin the workpiece 11, the device chips obtained by subsequent division of the workpiece 11 can be thinned.

Note that the workpiece 11 is subjected to so-called chamfering in which an outer peripheral portion of the workpiece 11 is ground to render the shape of an outer peripheral edge (side surface) of the workpiece 11 arcuate (see FIG. 2). When the workpiece 11 thus subjected to chamfering is thinned by grinding, the outer peripheral portion of the workpiece 11 is brought into a shape (knife edge shape) sharpened toward the radial-directionally outer side of the workpiece 11. When the outer peripheral portion of the workpiece 11 is brought into the knife edge shape, damaging such as chipping and cracking is liable to occur at the outer peripheral portion of the workpiece 11. In view of this, before thinning the workpiece 11 by grinding, processing called edge trimming is conducted in which the outer peripheral edge of the workpiece 11 is ground into an annular shape. When the edge trimming is performed, when the workpiece 11 is subsequently thinned by grinding the workpiece 11, the outer peripheral portion of the workpiece 11 is not brought into the knife edge shape. As a result, damaging of the outer peripheral portion of the workpiece 11 is restrained.

The edge trimming is conducted by cutting the outer peripheral portion of the workpiece 11 by the cutting blade 54A or the cutting blade 54B. Hereinafter, as an example, a case where an upper-layer workpiece 11A of a laminated workpiece 15 (see FIG. 2) obtained by adhering two workpieces 11 (the upper-layer workpiece 11A and a lower-layer workpiece 11B) are adhered to each other is subjected to edge trimming by use of the cutting blade 54A will be described. In this case, as the cutting blade 54A, there is used, for example, a cutting blade of which the thickness of a cutting edge is 1 to 3 mm.

When the laminated workpiece 15 is processed, the laminated workpiece 15 is held by the holding table 18, as depicted in FIG. 2. Specifically, the laminated workpiece 15 is disposed on the holding table 18 in such a manner that an upper surface side of the upper-layer workpiece 11A is exposed to the upper side and that a lower surface side of the lower-layer workpiece 11B faces the holding surface 18a. When a negative pressure of a suction source is made to act on the holding surface 18a in this state, the laminated workpiece 15 is suction held by the holding table 18.

Next, an outer peripheral portion of the upper-layer workpiece 11A is cut by the cutting blade 54A. Specifically, first, the height of the cutting unit 46A is adjusted by the moving mechanism 28 (see FIG. 1) such that the lower end of the cutting blade 54A is disposed at the same height as a boundary between the upper-layer workpiece 11A and the lower-layer workpiece 11B. In addition, the position of the cutting unit 46A in the Y-axis direction (indexing feeding direction) is adjusted by the moving mechanism 28 (see FIG. 1) such that the cutting blade 54A and an outer peripheral portion of the upper-layer workpiece 11A overlap with each other in front view. Then, while rotating the cutting blade 54A, the holding table 18 is moved (processing feeding) in the X-axis direction (processing feeding direction), to relatively move the holding table 18 and the cutting blade 54A. As a result, the cutting blade 54A cuts into a part of the outer peripheral portion of the upper-layer workpiece 11A.

Then, in a state in which the cutting blade 54A cuts into a part of the outer peripheral portion of the upper-layer workpiece 11A, the movement (processing feeding) of the holding table 18 is stopped, and the holding table 18 is rotated. As a result, the outer peripheral portion of the upper-layer workpiece 11A is cut in an annular shape by the cutting blade 54A and is removed. As a result, a side surface of the upper-layer workpiece 11A is processed into a flat surface shape substantially parallel to the thickness direction of the upper-layer workpiece 11A, whereby edge trimming of the upper-layer workpiece 11A is performed.

Note that while an example in which the workpiece 11 is processed by the cutting blade 54A mounted to the cutting unit 46A has been described above, the procedure in the case of processing the workpiece 11 by the cutting blade 54B mounted to the cutting unit 46B is similar to the above. In addition, the contents of processing performed by use of the cutting blades 54A and 54B are not limited to division and edge trimming of the workpiece 11.

Here, the cutting-in depth of the cutting blades 54A and 54B may slightly vary depending on the material of the workpiece 11, processing conditions, the operation status of the cutting apparatus 2, and the like. When a value of a desired cutting-in depth is only inputted to the cutting apparatus 2, the cutting of the workpiece 11 may not be performed in the cutting-in depth as intended. In view of this, in the cutting apparatus 2, a test of causing the cutting blades 54A and 54B to cut into a test workpiece 21 (see FIG. 2) held by the holding table 22 and confirming the lower end position (cutting-in depth) of the cutting blades 54A and 54B is carried out. Then, based on the results of this test, the height position (cutting-in depth) of the cutting blades 54A and 54B is adjusted.

The workpiece 21 is, for example, a member formed in a rectangular parallelepiped shape, and is formed of a material that can be cut by the cutting blades 54A and 54B. It is to be noted, however, that the shape of the workpiece 21 is not limited. In addition, examples of the material of the workpiece 21 are similar to those of the workpiece 11.

When detecting the lower end position of the cutting blade 54A, first, the position of the cutting unit 46A is adjusted such that the cutting blade 54A is located directly above the workpiece 21. Then, while rotating the cutting blade 54A, the cutting unit 46A is lowered to a predetermined height position, to cause the cutting blade 54A to cut into the front surface 21a side of the workpiece 21. Thereafter, the cutting unit 46A is raised, to space the cutting blade 54A from the workpiece 21.

Figure 3A:
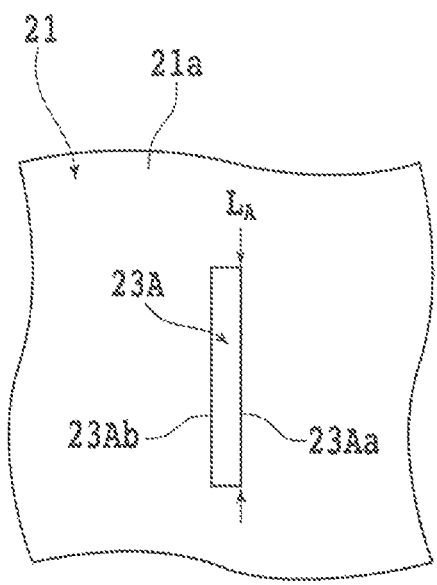
FIG. 3A is a plan view of a part of a workpiece cut by a first cutting blade.

FIG. 3A is a plan view of a part of the workpiece 21 cut by the cutting blade 54A. When the workpiece 21 is cut by the cutting blade 54A, a groove (cut groove) 23A of a predetermined depth is formed on the front surface 21a side of the workpiece 21. FIG. 3A depicts an example in which a groove 23A rectangular in plan view is formed in the workpiece 21. The width of the groove 23A corresponds to the width of a tip end portion (cutting edge) of the cutting blade 54A. In addition, the groove 23A includes end portions (end edges) 23Aa and 23Ab in the width direction (left-right direction in FIG. 3A) of the groove 23A. The end portion 23Aa corresponds to a region into which a side surface 54Aa (see FIG. 2) of the cutting blade 54A has cut, and the end portion 23Ab corresponds to a region into which a side surface 54Ab (see FIG. 2) of the cutting blade 54A has cut.

Figure 3B:
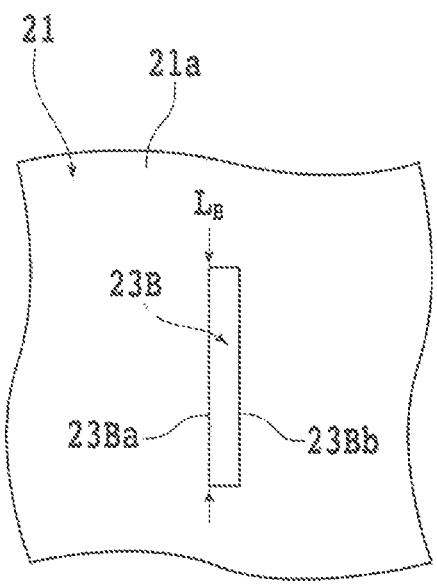
FIG. 3B is a plan view of a part of a workpiece cut by a second cutting blade.

On the other hand, when detecting the lower end position of the cutting blade 54B, the cutting blade 54B is made to cut into the workpiece 21 in a similar procedure. FIG. 3B is a plan view of a part of the workpiece 21 cut by the cutting blade 54B. When the workpiece 21 is cut by the cutting blade 54B, a groove (cut groove) 23B of a predetermined depth is formed on the front surface 21a side of the workpiece 21. The width of the groove 23B corresponds to the width of a tip end portion (cutting edge) of the cutting blade 54B. In addition, the groove 23B includes end portions (end edges) 23Ba and 23Bb in the width direction (left-right direction in FIG. 3B) of the groove 23B. The end portion 23Ba corresponds to a region into which a side surface 54Ba (see FIG. 2) of the cutting blade 54B has cut, and the end portion 23Bb corresponds to a region into which a side surface 54Bb (see FIG. 2) of the cutting blade 54B has cut.

The lower end positions of the cutting blades 54A and 54B when the cutting blades 54A and 54B cut into the workpiece 21 can be calculated respectively from the lengths of the grooves 23A and 23B. Specifically, let the radii of the cutting blades 54A and 54B be $R_A$ and $R_B$, and let the lengths of the grooves 23A and 23B be $L_A$ and $L_B$, then the lower end position (the cutting-in depth of the cutting blade 54A, or the depth of the groove 23A) $D_A$ and the lower end position (the cutting-in depth of the cutting blade 54B, or the depth of the groove 23B) $D_B$ of the cutting blade 54A are represented respectively by the formula (1) and the formula (2).

$$D_A = R_A - \sqrt{R_A^2 - \frac{L_A^2}{4}} \quad (1)$$

$$D_B = R_B - \sqrt{R_B^2 - \frac{L_B^2}{4}} \quad (2)$$

Therefore, by forming the workpiece 21 with the grooves 23A and 23B and measuring the lengths $L_A$ and $L_B$, the lower end positions $D_A$ and $D_B$ of the cutting blades 54A and 54B can be calculated. Then, by adjusting the height positions of the cutting blades 54A and 54B at the time of cutting the workpiece 11 as an original object of processing, based on the lower positions of the cutting blades 54A and 54B calculated, the accuracy of the cutting-in depth can be enhanced.

As the lengths $L_A$ and $L_B$ for use in calculation of the lower end positions $D_A$ and $D_B$, the lengths at optional positions in the width direction of the grooves 23A and 23B can be used. Therefore, the lower end position of the cutting blade 54A can be calculated based on the length $L_A$ (see FIG. 3A) of the end portion 23Aa of the groove 23A, and the lower end position of the cutting blade 54B can be calculated based on the length $L_B$ (see FIG. 3B) of the end portion 23Ba of the groove 23B.

Particularly, in the case of applying edge trimming to the workpiece 11, the side surface 54Aa side of the cutting blade 54A or the side surface 54Ba side of the cutting blade 54B cuts into an outer peripheral portion of the workpiece 11. Therefore, the values of the cutting-in depth at the end portion 23Aa of the groove 23A and the end portion 23Ba of the groove 23B are particularly important. In view of this, in the present embodiment, the lower end position of the cutting blade 54A is calculated based on the end portion 23Aa of the groove 23A, and the lower end position of the cutting blade 54B is calculated based on the end portion 23Ba of the groove 23B. A specific example of an operation of the cutting apparatus 2 at the time of detecting the lower end positions of the cutting blades 54A and 54B will be described below. Note that here a case where the lower end position of the cutting blade 54A is detected will be described as an example.

In the cutting blade position detecting method according to the present embodiment, the lower end position of the cutting blade 54A is detected based on the groove 23A formed in the workpiece 21, after which the workpiece 21 is further formed with another groove 23A, and the lower end position of the cutting blade 54A is detected. In other words, the detection of the lower end position of the cutting blade 54A is carried out a plurality of times for the same workpiece 21.

At the time of detecting the lower end position of the cutting blade 54A, the groove 23A is formed in the workpiece 21 (groove forming step). Specifically, the cutting blade 54A is made to cut into the front surface 21a side of the workpiece 21 according to the aforementioned procedure, to form a first groove 23A on the front surface 21a side of the workpiece 21.

Figure 4A:
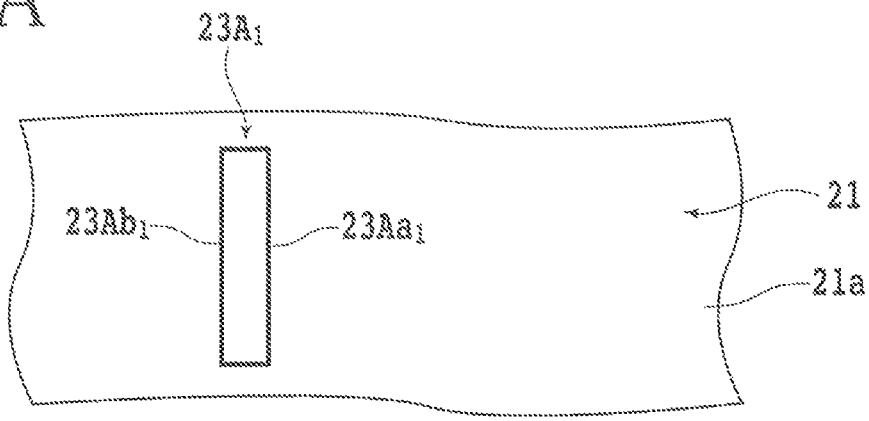
FIG. 4A is a plan view of a workpiece formed with a first groove.

FIG. 4A is a plan view of a workpiece 21 formed with the first groove 23A (groove $23A_1$). The groove $23A_1$ includes an end portion (end edge) $23Aa_1$ corresponding to the side surface 54Aa (see FIG. 2) of the cutting blade 54A, and an end portion (end edge) $23Ab_1$ corresponding to the side surface 54Ab (see FIG. 2) of the cutting blade 54A.

Next, based on the length of the end portion $23Aa_1$ of the groove $23A_1$, the lower end position of the cutting blade 54A is calculated (calculating step). In the calculating step, first, the front surface 21a side of the workpiece 21 held by the holding table 22 is imaged by the imaging unit 48 (see FIG. 1). In this instance, the holding table 22 is moved by the moving mechanism 6, and the imaging unit 48 is moved by the moving mechanism 28, whereby alignment between the workpiece 21 and the imaging unit 48 is performed. The groove $23A_1$ is represented in an image (picked-up image) acquired by the imaging.

Subsequently, based on the picked-up image acquired by the imaging unit 48, the lower end position of the cutting blade 54A is detected. Specifically, the length of the end portion 23Aa$_1$ of the groove 23A$_1$ depicted in the picked-up image is measured, and the lower end position of the cutting blade 54A is calculated based on the length of the end portion 23Aa$_1$. The measurement of the length of the end portion 23Aa$_1$ and the calculation of the lower end position of the cutting blade 54A are performed, for example, by use of the processing section 62 and the storage section 64 (see FIG. 1) possessed by the control section 60.

Figure 5:
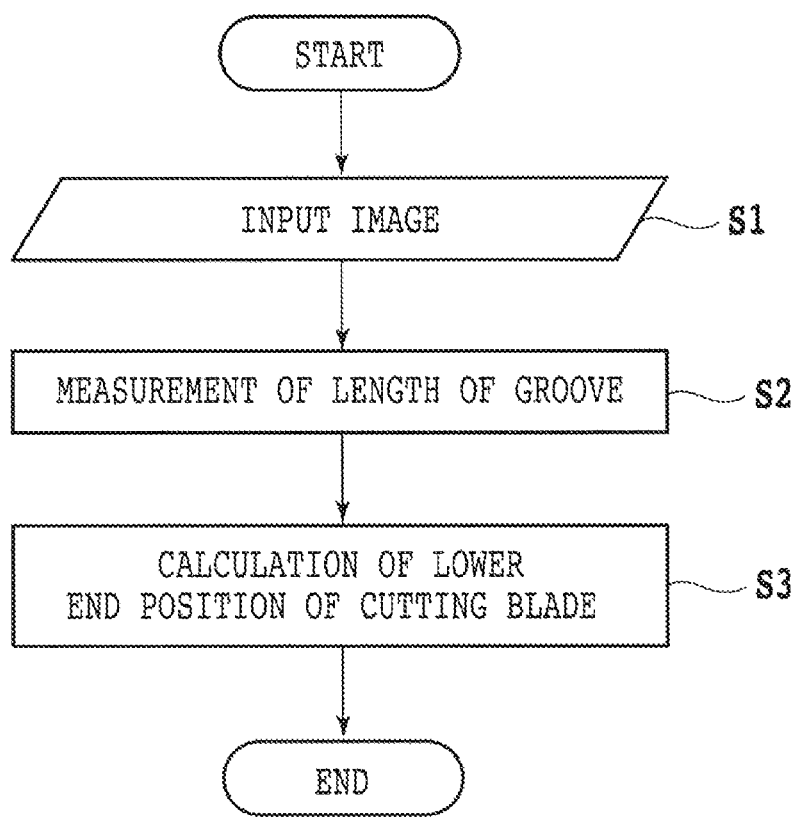
FIG. 5 is a flow chart depicting operations of a control section.

FIG. 5 is a flow chart depicting the operation of the control section 60 at the time of detecting the lower end position of the cutting blade 54A. When the workpiece 21 is imaged by the imaging unit 48, the image (picked-up image) obtained by the imaging is inputted to the control section 60 (step S1). Then, the control section 60 measures the length of the end portion 23Aa$_1$ of the groove 23A$_1$ formed in the workpiece 21 (step S2). The length of the end portion 23Aa$_1$ is measured, for example, by subjecting the picked-up image to image processing. Specifically, the processing section 62 subjects the picked-up image to an edge detection processing to specify the outline of the groove 23A$_1$ and calculates the difference between the coordinates of both ends (the upper end and the lower end in FIG. 4A) of the end portion 23Aa$_1$ of the groove 23A$_1$. As a result, the length of the end portion 23Aa$_1$ is acquired. It is to be noted, however, that the method for measuring the length of the end portion 23Aa$_1$ of the groove 23A$_1$ is not limited. For example, the picked-up image including the groove 23A$_1$ may be displayed in an enlarged form on the display section 58 (see FIG. 1), and the length of the end portion 23Aa$_1$ may be actually measured.

Next, the control section 60 calculates the lower end position of the cutting blade 54A (step S3), based on the length of the end portion 23Aa$_1$ of the groove 23A$_1$ calculated. Specifically, the aforementioned formula (1) and the radius R$_A$ of the cutting blade 54A are preliminarily stored in the storage section 64. When the length of the end portion 23Aa$_1$ of the groove 23A$_1$ is calculated, the processing section 62 makes an access to the storage section 64 and reads out the formula (1) and the radius R$_A$ of the cutting blade 54A. Then, the processing section 62 carries out a processing of applying the radius R$_A$ and the length (L$_A$) of the end portion 23Aa$_1$ of the groove 23A$_1$ to the formula (1) to calculate the lower end position (D$_A$) of the cutting blade 54A. The lower end position of the cutting blade 54A thus calculated is, for example, displayed on the display section 58. As a result, the lower end position of the cutting blade 54A is confirmed by the operator. Note that the control section 60 may display that an abnormal state is present on the display section 58 in the case where the lower end position of the cutting blade 54A calculated is an abnormal value.

The calculating step as above is realized, for example, by executing a program stored in the storage section 64 by the processing section 62. Specifically, a program describing a series of processing (steps S2, S3, etc.) to be conducted in the calculating step is preliminarily stored in the storage section 64. When the picked-up image is inputted from the imaging unit 48 to the control section 60 (step S1), the processing section 62 reads out the program from the storage section 64, and executes the program, to calculate the length of the end portion 23Aa$_1$ of the groove 23A$_1$.

The detection of the lower end position of the cutting blade 54A as above is carried out a plurality of times by using the same workpiece 21. Therefore, at the time of detecting the lower end position of the cutting blade 54A at the second and later times, the cutting blade 54A again cuts into the workpiece 21 having already been formed with the groove 23A$_1$, to form the second groove 23A (groove forming step). By use of the second groove 23A, the aforementioned calculating step is performed.

Figure 4B:
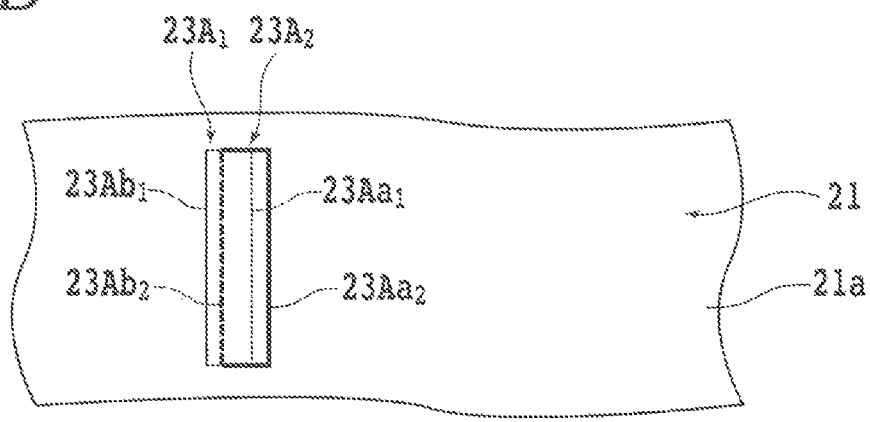
FIG. 4B is a plan view of a workpiece formed with a second groove.

FIG. 4B is a plan view of the workpiece 21 formed with the second groove 23A (groove 23A$_2$). The groove 23A$_2$ includes an end portion (end edge) 23Aa$_2$ corresponding to the side surface 54Aa (see FIG. 2) of the cutting blade 54A, and an end portion (end edge) 23Ab$_2$ corresponding to the side surface 54Ab (see FIG. 2) of the cutting blade 54A. In FIG. 4B, the first groove 23A$_1$ already formed in the workpiece 21 is indicated by a line thinner than the groove 23A$_2$. Note that an end portion 23Ab$_2$ indicated by a dotted line in FIG. 4B is a virtual end portion of the groove 23A$_2$, which corresponds to the position where the side surface 54Ab of the cutting blade 54A is positioned at the time of forming the second groove 23A$_2$. In addition, in FIG. 4B, the end portion 23Aa$_1$ of the first groove 23A$_1$ removed by the formation of the second groove 23A$_2$ is indicated by a dotted line on a virtual basis. Hereinafter, also in other figures, a virtual end portion of the groove is indicated by a dotted line.

In the second-time groove forming step, the cutting blade 54A is made to cut into the front surface 21a side of the workpiece 21, in such a manner that the side surface 54Aa of the cutting blade 54A does not overlap with the groove 23A (groove 23A$_1$) already formed in the workpiece 21, and the side surface 54Ab of the cutting blade 54A overlaps with the groove 23A (groove 23A$_1$) already formed in the workpiece 21. As a result, a groove 23A$_2$ of which one end portion (end portion 23Aa$_2$) in the width direction does not overlap with the groove 23A$_1$ whereas the other end portion (end portion 23Ab$_2$) in the width direction overlaps with the groove 23A$_1$ is formed in the workpiece 21.

Next, the calculating step is carried out to calculate the lower end position of the cutting blade 54A. Here, the calculation of the lower end position of the cutting blade 54A is conducted based on the length of the end portion 23Aa$_2$ of the groove 23A$_2$. Since the groove 23A$_2$ is formed such that at least the end portion 23Aa$_2$ does not overlap with the groove (groove 23A$_1$) already formed in the workpiece 21, as depicted in FIG. 4B, the end portion 23Aa$_2$ of the groove 23A$_2$ is clearly imaged. Then, the control section 60 calculates the lower end position of the cutting blade 54A based on the length of the end portion 23Aa$_2$ (see FIG. 5).

In the case where the lower end position of the cutting blade 54A is thereafter further detected, the cutting blade 54A again cuts into the workpiece 21 already formed with the grooves 23A$_1$ and 23A$_2$, whereby a third groove 23A is formed (groove forming step). Then, the aforementioned calculating step is carried out using the third groove 23A.

Figure 4C:
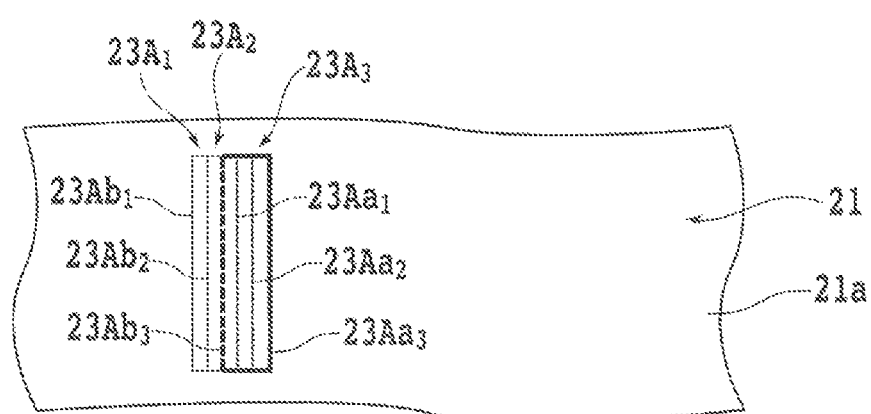
FIG. 4C is a plan view of a workpiece formed with a third groove.

FIG. 4C is a plan view of the workpiece 21 formed with the third groove 23A (groove 23A$_3$). The groove 23A$_3$ includes an end portion (end edge) 23Aa$_3$ corresponding to the side surface 54Aa (see FIG. 2) of the cutting blade 54A, and an end portion (end edge) 23Ab$_3$ corresponding to the side surface 54Ab (see FIG. 2) of the cutting blade 54A. In FIG. 4C, the grooves 23 (the groove 23A$_1$, the groove 23A$_2$) already formed in the workpiece 21 are indicated by a line thinner than the groove 23A$_3$.

In the third groove forming step, the cutting blade 54A is made to cut into the front surface 21a side of the workpiece 21 in such a manner that the side surface 54Aa of the cutting blade 54A does not overlap with the grooves 23A (grooves 23A$_1$ and 23A$_2$) already formed in the workpiece 21 and that the side surface 54Ab of the cutting blade 54A overlaps with the grooves 23A (grooves 23A$_1$ and 23A$_2$) already formed in the workpiece 21. As a result, the groove $23A_3$ of which one end portion (end portion $23Aa_3$) in the width direction does not overlap with the grooves $23A_1$ and $23A_2$ whereas the other end portion (end portion $23Ab_3$) in the width direction overlaps with the grooves $23A_1$ and $23A_2$ is formed.

Next, the calculating step is carried out to calculate the lower end position of the cutting blade 54A. Here, the calculation of the lower end position of the cutting blade 54A is performed based on the length of the end portion $23Aa_3$ of the groove $23A_3$. Since the groove $23A_3$ is formed such that at least the end portion $23Aa_3$ does not overlap with the grooves (grooves $23A_1$ and $23A_2$) already formed in the workpiece 21, as depicted in FIG. 4C, the end portion $23Aa_3$ of the groove $23A_3$ is clearly imaged. Then, the control section 60 calculates the lower end position of the cutting blade 54A based on the length of the end portion $23Aa_3$ (see FIG. 5).

As has been described above, in the present embodiment, the second and latter grooves 23A are each formed such that a part thereof overlaps with the other groove or grooves 23A already formed in the workpiece 21. As a result, more grooves 23A can be formed in the workpiece 21, and the detection of the lower end position of the cutting blade 54A can be carried out a multiplicity of times while using a single sheet of workpiece 21. Note that the fourth-time and latter detections of the lower end position of the cutting blade 54A are performed based on the length of the fourth and latter grooves 23A formed in the workpiece 21 by a similar procedure.

Figure 6:
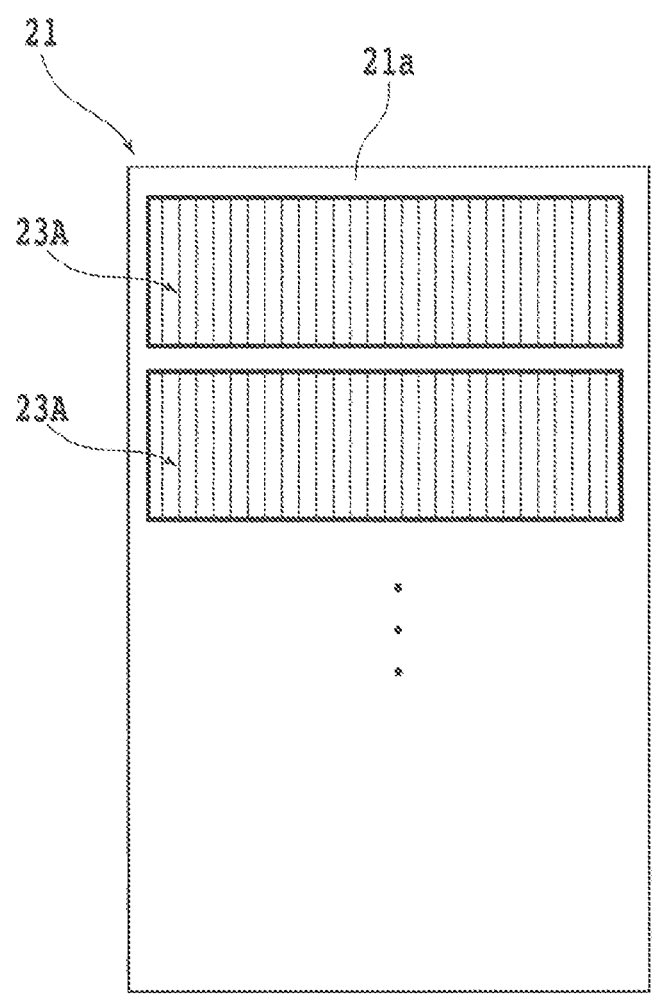
FIG. 6 is a plan view of a workpiece after detection of a lower end position of the cutting blade is carried out a plurality of times.

FIG. 6 is a plan view of a workpiece 21 after detection of the lower end position of the cutting blade 54A is carried out a plurality of times. The workpiece 21 is formed with a plurality of grooves 23A such that they are connected to the other grooves 23A. Therefore, more grooves 23A can be formed in one sheet of workpiece 21, as compared to the case where a gap is present between two adjacent grooves 23A as in the related art. As a result, the amount of the workpiece 21 to be used is reduced, and cost is reduced.

Note that while the case where the lower end position of the cutting blade 54A is detected has been described above, detection of the lower end position of the cutting blade 54B can also be carried out by the same procedure. In this case, the cutting blade 54B is made to cut into the front surface 21a side of the workpiece 21, in such a manner that the side surface 54Ba of the cutting blade 54B does not overlap with the groove 23B already formed in the workpiece 21 and that the side surface 54Bb of the cutting blade 54B overlaps with the groove 23B already formed in the workpiece 21. Besides, the calculation of the lower end position of the cutting blade 54B is performed based on the length of the end portion 23Ba of the groove 23B.

As has been described above, in the cutting blade position detecting method according to the present embodiment, the cutting blades 54A and 54B are made to further cut into the workpiece 21 already formed with the first groove (the groove 23A or the groove 23B), to form the workpiece 21 with a second groove (the groove 23A or the groove 23B) of which one end portion in the width direction does not overlap with the first groove whereas the other end portion in the width direction overlaps with the first groove. As a result, many grooves can be formed in one sheet of workpiece 21, and the amount of the workpiece 21 to be used is reduced.

Note that the case where the detections of the lower end positions of the cutting blade 54A and the cutting blade 54B are carried out individually has been described in the present embodiment. It is to be noted, however, that the detections of the lower end positions of the cutting blade 54A and the cutting blade 54B may be carried out alternately or at the same timing, using the same workpiece 21. An example in which the lower end positions of both the cutting blades 54A and 54B are detected will be described below.

Figure 7A:
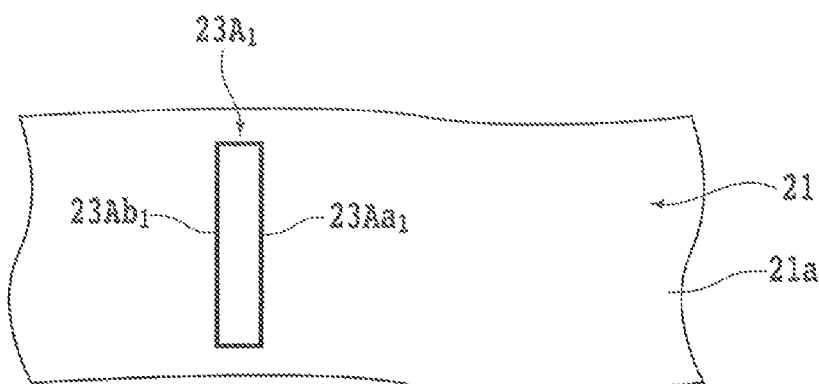
FIG. 7A is a plan view of a workpiece formed with a first groove.

First, the cutting blade 54A is made to cut into the workpiece 21, to form a first groove (groove forming step). FIG. 7A is a plan view of the workpiece 21 formed with the first groove (groove $23A_1$). Thereafter, the calculating step is carried out to calculate the lower end position of the cutting blade 54A based on the length of the end portion $23Aa_1$ of the groove $23A_1$.

Figure 7B:
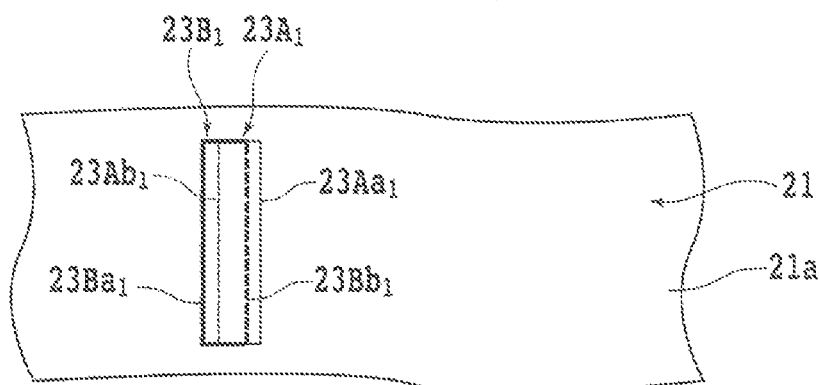
FIG. 7B is a plan view of a workpiece formed with a second groove.

Next, the cutting blade 54B is made to cut into the workpiece 21, to form a second groove (groove forming step). FIG. 7B is a plan view of the workpiece 21 formed with the second groove (groove $23B_1$). In this instance, the groove $23B_1$ is formed in such a manner that one end portion (end portion $23Ba_1$) in the width direction does not overlap with the groove $23A_1$ whereas the other end portion (end portion $23Bb_1$) in the width direction overlaps with the groove $23A_1$. Thereafter, the calculating step is carried out to detect the lower end position of the cutting blade 54B based on the end portion $23Ba_1$ of the groove $23B_1$.

Figure 7C:
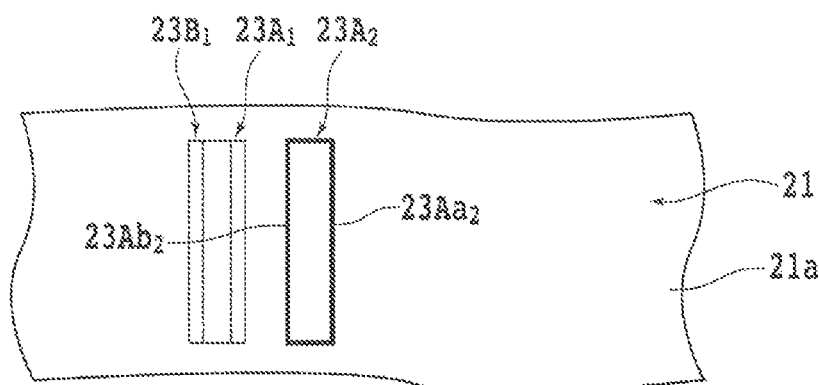
FIG. 7C is a plan view of a workpiece formed with a third groove.

Subsequently, the cutting blade 54A is made to cut into the workpiece 21, to form a third groove (groove forming step). FIG. 7C is a plan view of the workpiece 21 formed with the third groove (groove $23A_2$). In this instance, the groove $23A_2$ is formed in such a manner as not to overlap with the other grooves (grooves $23A_1$ and $23B_1$) formed in the workpiece 21. Thereafter, the calculating step is conducted to detect the lower end position of the cutting blade 54A based on the end portion $23Aa_2$ of the groove $23A_2$.

Figure 7D:
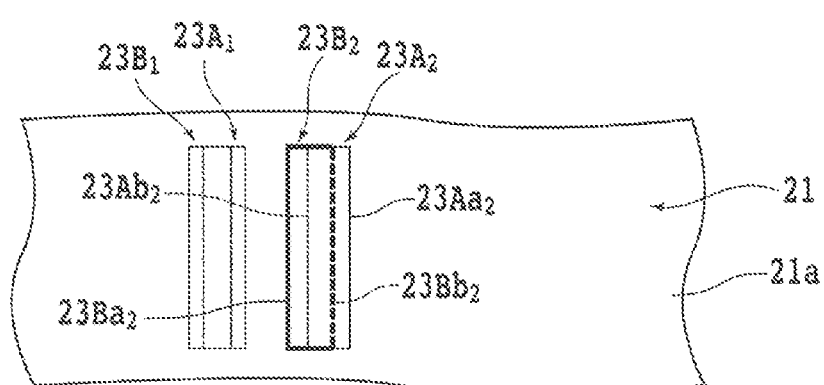
FIG. 7D is a plan view of a workpiece formed with a fourth groove.

Next, the cutting blade 54B is made to cut into the workpiece 21, to form a fourth groove (groove forming step). FIG. 7D is a plan view of the workpiece 21 formed with the fourth groove (groove $23B_2$). In this instance, the groove $23B_2$ is formed in such a manner that one end portion (end portion $23Ba_2$) in the width direction does not overlap with the other grooves (grooves $23A_1$, $23B_1$, and $23A_2$) whereas the other end portion (end portion $23Bb_2$) in the width direction overlaps with the groove $23A_2$. Thereafter, the calculating step is carried out to detect the lower end position of the cutting blade 54B based on the end portion $23Ba_2$ of the groove $23B_2$.

In this way, in the case of detecting the lower end positions of the cutting blades 54A and 54B alternately, the groove forming steps are conducted in such a manner that a part of the groove 23A formed by the cutting blade 54A and a part of the groove 23B formed by the cutting blade 54B overlap with each other. As a result, the number of grooves that can be formed in one sheet of workpiece 21 is increased, and the amount of the workpiece 21 to be used is reduced.

In addition, while an example in which the detections of the lower end positions of the cutting blade 54A and the cutting blade 54B are carried out independently has been described in the above, the detections of the lower end positions of the cutting blade 54A and the cutting blade 54B may be performed at the same timing. Specifically, after the groove $23A_1$ and the groove $23B_1$ (the groove $23A_2$ and the groove $23B_2$) are formed in the workpiece 21, the groove $23A_1$ and the groove $23B_1$ (the groove $23A_2$ and the groove $23B_2$) may be imaged simultaneously, to obtain one sheet of picked-up image in which the groove $23A_1$ and the groove $23B_1$ (the groove $23A_2$ and the groove $23B_2$) are represented. In this case, the calculating step is carried out using the picked-up image in which the groove $23A_1$ and the groove $23B_1$ (the groove $23A_2$ and the groove $23B_2$) are represented. As a result, the lower end positions of the cutting blade 54A and the cutting blade 54B are calculated simultaneously.

Figure 8A:
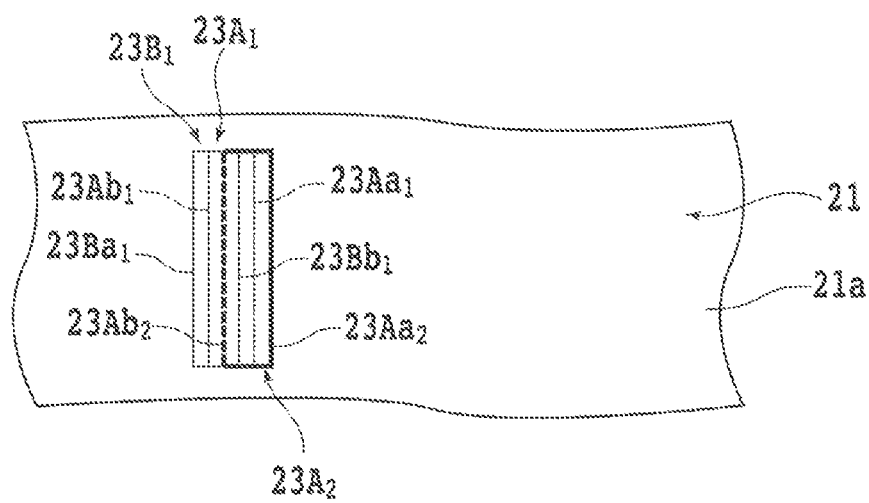
FIG. 8A is a plan view of a workpiece formed with a third groove so as to overlap with a first groove and a second groove.
Figure 8B:
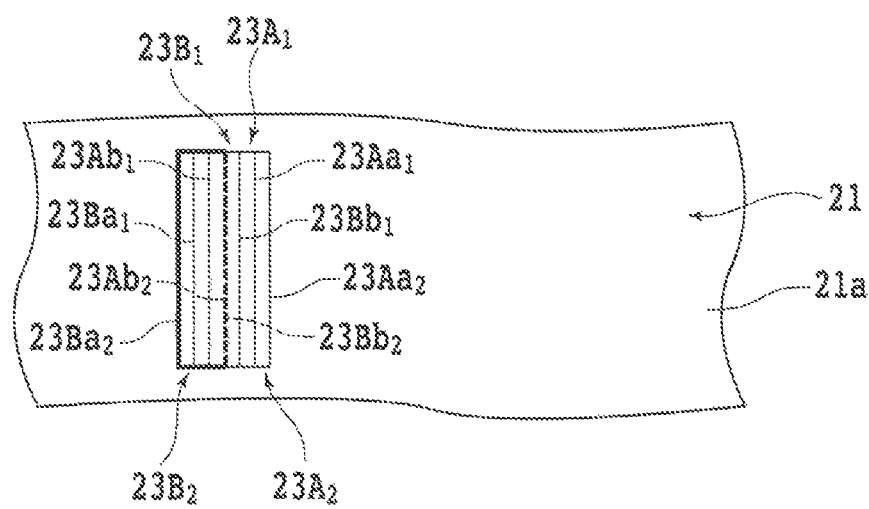
FIG. 8B is a plan view of a workpiece formed with a fourth groove so as to overlap with a first groove and a second groove.

Besides, each of the third groove (groove 23$A_2$) and the fourth groove (groove 23$B_2$) may be formed such that a part thereof overlaps with the first groove (groove 23$A_1$) or the second groove (groove 23$B_1$). FIG. 8A is a plan view of a workpiece 21 formed with the third groove (groove 23$A_2$) so as to overlap with the first groove (groove 23$A_1$) and the second groove (groove 23$B_1$). In addition, FIG. 8B is a plan view of a workpiece 21 formed with the fourth groove (groove 23$B_2$) so as to overlap with the first groove (groove 23$A_1$) and the second groove (groove 23$B_1$).

After the lower end positions of the cutting blades 54A and 54B are detected based on the grooves 23$A_1$ and 23$B_1$ formed in the workpiece 21 (see FIG. 7B), the cutting blade 54A is made to cut into the workpiece 21, to form the third groove (groove 23$A_2$) (groove forming step). In this instance, the groove 23$A_2$ is formed in such a manner that one end portion (end portion 23$Aa_2$) in the width direction does not overlap with the grooves (grooves 23$A_1$ and 23$B_1$) already formed in the workpiece 21 whereas the other end portion (end portion 23$Ab_2$) in the width direction overlaps with the groove or grooves (groove 23$A_1$ or the groove 23$B_1$) already formed in the workpiece 21 (see FIG. 8A). Thereafter, the calculating step is carried out, to detect the lower end position of the cutting blade 54A based on the length of the end portion 23$Aa_2$ of the groove 23$A_2$.

Next, the cutting blade 54B is made to cut into the workpiece 21, to form the fourth groove (groove 23$B_2$) (groove forming step). In this instance, the groove 23$B_2$ is formed in such a manner that one end portion (end portion 23$Ba_2$) in the width direction does not overlap with the grooves (grooves 23$A_1$, 23$B_1$, and 23$A_2$) already formed in the workpiece 21 whereas the other end portion (end portion 23$Bb_2$) in the width direction overlaps with the groove or grooves (the groove 23$A_1$, the groove 23$B_1$, or the groove 23$A_2$) already formed in the workpiece 21 (see FIG. 8B). Thereafter, the calculating step is carried out to detect the lower end position of the cutting blade 54B based on the end portion 23$Ba_2$ of the groove 23$B_2$.

By forming the third and latter grooves so as to overlap with the other groove or grooves already formed in the workpiece 21 as above-mentioned, the amount of the workpiece 21 to be used is further reduced. Note that in the above-described case, after the groove 23$A_2$ and the groove 23$B_2$ are formed in the workpiece 21 (see FIG. 8B), the groove 23$A_2$ and the groove 23$B_2$ may be imaged simultaneously, to acquire a picked-up image in which the groove 23$A_2$ and the groove 23$B_2$ are represented. In this case, based on the same picked-up image, the lower end positions of the cutting blade 54A and the cutting blade 54B are detected.

In addition, while the case where the lower end positions of the cutting blades 54A and 54B are detected using the workpiece 21 held by the holding table 22 has been described in the above embodiment, the workpiece 21 may be held by the holding table 18 and the grooves may be formed in the workpiece 21. Besides, of the workpiece 11 held by the holding table 18, an outer peripheral portion (peripheral surplus region) not formed with the devices 13 may be formed with the grooves, whereby the lower end positions of the cutting blades 54A and 54B can be detected.

Other than the above, the structures, methods, and the like according to the above embodiment may be modified, as required, insofar as the modifications do not depart from the scope of the object of the present invention.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A cutting blade position detecting method for detecting a lower end position of a cutting blade, using a cutting apparatus including a holding table that holds a workpiece, and a cutting unit in which the cutting blade for cutting the workpiece held by the holding table is mounted in a rotatable state, the cutting blade position detecting method comprising:

a groove forming step of causing the cutting blade to further cut into the workpiece including a first groove formed by causing the cutting blade to cut into the workpiece, to form the workpiece with a second groove of which one end portion in a width direction does not overlap with the first groove whereas another end portion in the width direction overlaps with the first groove; and a calculating step of calculating the lower end position of the cutting blade based on a length of the one end portion in the width direction of the second groove formed in the workpiece.

2. The cutting blade position detecting method of claim 1, wherein a length of the first groove is approximately the same as the length of the one end portion of the second groove.

3. The cutting blade position detecting method of claim 1, further comprising:

causing the cutting blade to further cut into the workpiece to form a third groove adjacent the second groove, wherein one end portion of the third groove in a width direction does not overlap with the second groove or the first groove and another end portion of the third groove in the width direction overlaps with the first groove and the second groove; and calculating the lower end position of the cutting blade based on a length of the one end portion in the width direction of the third groove formed in the workpiece.

4. The cutting blade position detecting method of claim 3, further comprising:

causing the cutting blade to further cut into the workpiece to form a fourth groove adjacent the first groove, wherein one end portion of the fourth groove in a width direction does not overlap with the first groove, the second groove or the third groove, and another end portion of the fourth groove in the width direction overlaps with the first groove, the second groove and the third groove; and calculating the lower end position of the cutting blade based on a length of the one end portion in the width direction of the fourth groove formed in the workpiece.

5. The cutting blade position detecting method of claim 1, further comprising:

causing the cutting blade to cut into the workpiece to form a third groove adjacent the first groove and the second groove, wherein the third groove does not overlap with the second groove or the first groove; and calculating the lower end position of the cutting blade based on a length of one end portion in the width direction of the third groove formed in the workpiece.

6. The cutting blade position detecting method of claim 5, further comprising:

causing the cutting blade to further cut into the workpiece to form a fourth groove of which one end portion in a width direction does not overlap with the third groove and another end portion in the width direction overlaps with the third groove; and a calculating step of calculating the lower end position of the cutting blade based on a length of the one end portion in the width direction of the fourth groove formed in the workpiece.

\* \* \* \* \*